(12) United States Patent
Lee

(10) Patent No.: US 10,056,569 B2
(45) Date of Patent: Aug. 21, 2018

(54) DISPLAY APPARATUS

(71) Applicant: Samsung Display Co., Ltd., Yongin-si, Gyeonggi-do (KR)

(72) Inventor: Keunsoo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/801,115

(22) Filed: Nov. 1, 2017

(65) Prior Publication Data

US 2018/0123062 A1   May 3, 2018

(30) Foreign Application Priority Data

Nov. 2, 2016   (KR) .......................... 10-2016-0145216

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 27/32* | (2006.01) | |
| *B32B 3/30* | (2006.01) | |

(52) U.S. Cl.
CPC ............ *H01L 51/0097* (2013.01); *B32B 3/30* (2013.01); *H01L 27/3276* (2013.01); *B32B 2307/206* (2013.01); *B32B 2457/20* (2013.01); *H01L 2251/5338* (2013.01); *H01L 2251/5392* (2013.01)

(58) Field of Classification Search
CPC ..... H01L 2924/181; H01L 2224/73265; H01L 22/30; H01L 27/3223; H01L 27/3244; H01L 51/0097
See application file for complete search history.

(56) References Cited

U.S. PATENT DOCUMENTS

| | | | | |
|---|---|---|---|---|
| 2011/0037095 A1* | 2/2011 | Park | ...................... | H01L 51/525 257/100 |
| 2014/0085281 A1* | 3/2014 | Lim | ...................... | G09G 3/3266 345/206 |
| 2014/0097430 A1* | 4/2014 | Park | ...................... | H01L 27/1218 257/48 |
| 2015/0036299 A1 | 2/2015 | Namkung et al. | | |
| 2016/0227624 A1 | 8/2016 | Yun | | |
| 2016/0315284 A1* | 10/2016 | Jeon | ...................... | H01L 51/5246 |

FOREIGN PATENT DOCUMENTS

| | | |
|---|---|---|
| KR | 10-2014-0064156 A | 5/2014 |
| KR | 10-2015-0015257 A | 2/2015 |
| KR | 10-2016-0080289 A | 7/2016 |

* cited by examiner

*Primary Examiner* — Jaehwan Oh
*Assistant Examiner* — John M Parker
(74) *Attorney, Agent, or Firm* — Lewis Roca Rothgerber Christie LLP

(57) ABSTRACT

Provided is a display apparatus which may reduce or minimize the occurrence of a defect due to an external shock while improving an expected lifespan thereof. The display apparatus includes a substrate having a first area, a second area, and a bending area between the first area and the second area, and being configured to be bent around a bending axis extending in a first direction, an inorganic insulating portion on the bending area, having a width along an edge of the substrate, and including a plurality of dams defining a plurality of grooves, and a first organic layer on the bending area, and partially overlapping the inorganic insulating portion to cover at least some of the dams.

18 Claims, 8 Drawing Sheets

DISPLAY APPARATUS

CROSS-REFERENCE TO RELATED APPLICATION

This application claims priority to, and the benefit of, Korean Patent Application No. 10-2016-0145216, filed on Nov. 2, 2016 in the Korean Intellectual Property Office, the disclosure of which is incorporated herein in its entirety by reference.

BACKGROUND

1. Field

One or more embodiments relate to a display apparatus that may reduce or minimize the occurrence of a defect caused by an external shock.

2. Description of the Related Art

Generally, a display apparatus includes a display unit above a substrate. Visibility of the display apparatus at various angles may be improved, or the area of a non-display area thereof may be reduced, by bending at least a portion thereof.

However, in a display apparatus of the related art, a defect may occur during a process of manufacturing a bent display apparatus, or life of the display apparatus may decrease as a result of the process.

SUMMARY

One or more embodiments include a display apparatus that may reduce or minimize the occurrence of a defect due to an external shock, while also potentially improving a life span of the display apparatus, although the present disclosure is not limited thereby.

Additional aspects will be set forth in part in the description that follows and, in part, will be apparent from the description, or may be learned by practice of the presented embodiments.

According to one or more embodiments, a display apparatus includes a substrate having a first area, a second area, and a bending area between the first area and the second area, and being configured to be bent around a bending axis extending in a first direction, an inorganic insulating portion on the bending area, having a width along an edge of the substrate, and including a plurality of dams defining a plurality of grooves, and a first organic layer on the bending area, and partially overlapping the inorganic insulating portion to cover at least some of the dams.

At least a portion of the first organic layer may be filled in the plurality of grooves.

The inorganic insulating portion may include a first insulating layer on the substrate, and a second insulating layer on the first insulating layer.

The plurality of grooves may penetrate the second insulating layer.

The plurality of grooves may expose at least a portion of the first insulating layer.

The plurality of grooves may penetrate the first insulating layer and the second insulating layer.

The plurality of grooves may expose at least a portion of the substrate.

The display apparatus may further include a first wiring portion on the first organic layer.

The display apparatus may further include a second organic layer on the first organic layer.

The display apparatus may further include a second wiring portion on the second organic layer.

The first wiring portion and the second wiring portion might not overlap each other.

The bending area may include an edge area having a width along the edge of the substrate, and a wiring area at a side of the edge area, and the inorganic insulating portion may be on the edge area outside of the wiring area.

The first organic layer may be on the wiring area and is on at least a portion of the edge area.

The plurality of dams may be located over an entire surface of the inorganic insulating portion.

The plurality of dams may be located over a portion of the inorganic insulating portion.

The first organic layer may cover all or some of the plurality of dams.

The display apparatus may further include a display unit on the first area of the substrate, and a panel driver unit on the second area of the substrate.

According to one or more of the above embodiments, a display apparatus, which may reduce or minimize the likelihood of the occurrence of a defect due to an external shock, while also improving a lifespan of the display apparatus, may be implemented. However, the present disclosure is not limited by such an aspect.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
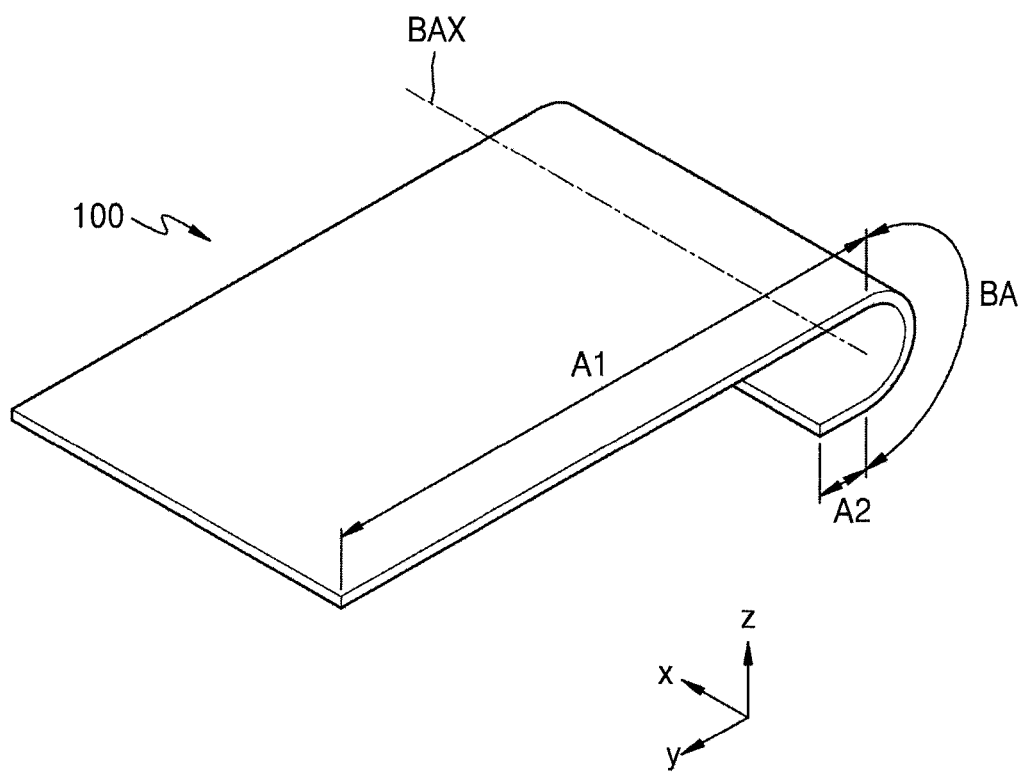
FIG. 1 is a schematic perspective view of a display apparatus according to an embodiment.

Features of the inventive concept and methods of accomplishing the same may be understood more readily by reference to the following detailed description of embodiments and the accompanying drawings. Hereinafter, embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the following description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
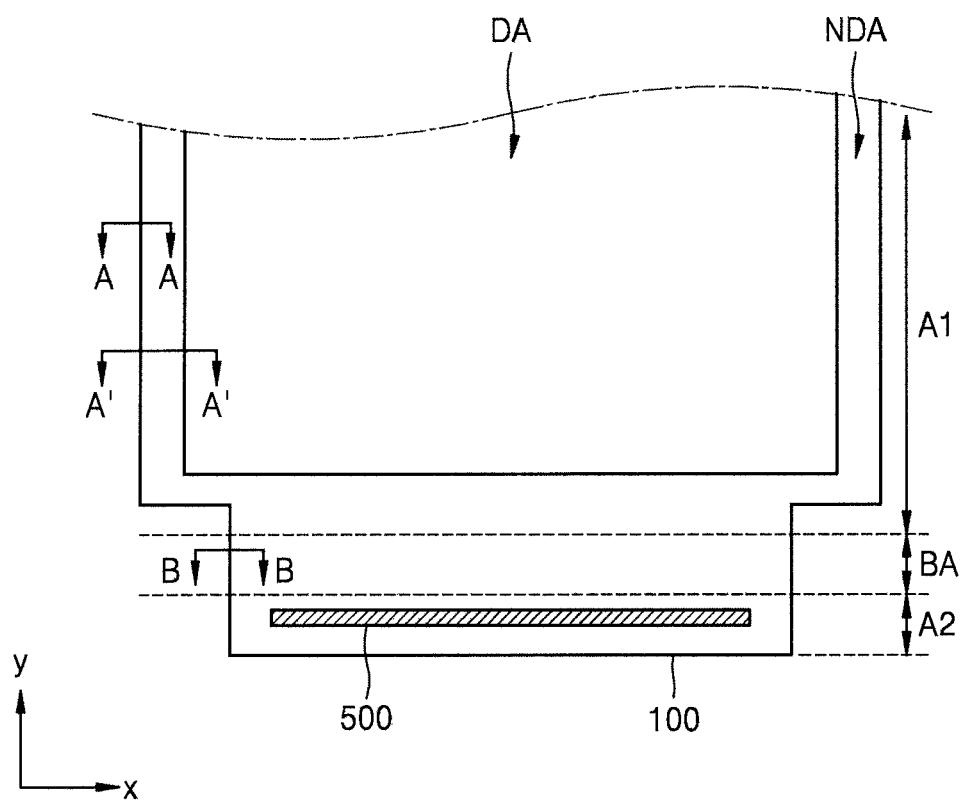
FIG. 2 is a schematic plan view of a shape of a portion of the display apparatus of FIG. 1 before being bent.

FIG. 1 is a schematic perspective view of a display apparatus according to an embodiment. FIG. 2 is a schematic plan view of a shape of a portion of the display apparatus of FIG. 1 before being bent.

Referring to FIGS. 1 and 2, in the display apparatus according to the present embodiment, a portion of a substrate 100, which is a portion of the display apparatus, is bent, as illustrated in FIG. 1, and the display apparatus has a shape that is partially bent like the substrate 100. However, for convenience of description, FIG. 2 illustrates that the display apparatus is not bent. For reference, cross-sectional views or plan views of embodiments below illustrate that the display apparatus as not being bent, for convenience of illustration and description.

Referring to FIGS. 1 and 2, the substrate 100 of the display apparatus according to the present embodiment has a bending area BA extending in a first direction (+x direction). The bending area BA is between a first area A1 and a second area A2 in a second direction (+y direction) that crosses the first direction (+x direction). Also, as illustrated in FIG. 1, the substrate 100 is bent around a bending axis BAX extending in the first direction (+x direction). In the present embodiment, the first area A1 and the second area A2, with the bending area BA therebetween, may be understood as non-bending, or unbent, areas.

The substrate 100 may include various materials having flexible or bendable characteristics. For example, the substrate 100 may include a polymer resin, such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

The first area A1 includes a display area DA, and a non-display area NDA that is located at the outside of, or at a periphery of, the display area DA along the edge of the substrate 100. A display unit may be located at the display area DA, and may externally display an image by controlling emission of a display device. In the present embodiment, the display device may be, for example, an organic light-emitting device. In another embodiment, the display device may be a liquid crystal device.

The second area A2 includes the non-display area NDA (e.g., a portion of the non-display area NDA). A panel driver unit 500 may be in the non-display area NDA of the second area A2. The panel driver unit 500 is connected to a pad portion of the substrate 100, and respectively supplies a data signal and a gate signal (hereinafter simply referred to as 'signals') to a data line and a gate line. The panel driver unit 500 may be, for example, a driver IC, and may be mounted on the pad portion of the substrate 100. In this case, the pad portion may be directly electrically connected to the driver IC.

In the present embodiment, as illustrated in FIG. 2, a width of the second area A2 of the substrate 100 in the first direction (+x direction) may be less than a width of the first area A1 of the substrate 100 in the first direction (+x direction). Also, a width of the bending area BA of the substrate 100 in the first direction (+x direction) may be less than the width of the first area A1 of the substrate 100 in the first direction (+x direction). That is, widths of the bending area BA and the second area A2, in which the display area DA is not located, may be less than a width of the first area A1, in which the display area DA is located. The reason for this is that when a reduced area in which the panel driver unit 500 is to be located is provided as the second area A2, a width of the bending area BA may decrease along a width of the second area A2, and as a width of the bending area BA decreases, it becomes easier to bend a corresponding portion of the substrate 100.

However, the present disclosure is not necessarily limited to the above. In another embodiment, the first area A1, the bending area BA, and the second area A2 may all have the same width so that the substrate 100 may have a rectangular shape. Alternatively, the substrate 100 may have a shape with a width gradually decreasing in a direction from the bending area BA to the second area A2 as compared to a width of the first area A1.

Figure 3:
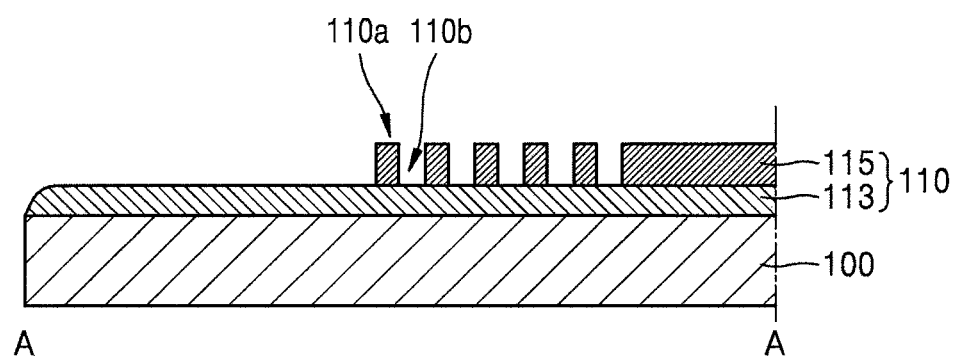
FIG. 3 is a schematic cross-sectional view of a cross-section of the display apparatus of FIG. 2, taken along the line A-A.

FIG. 3 is a schematic cross-sectional view of a cross-section of the display apparatus of FIG. 2, taken along the line A-A.

Regarding the display apparatus according to the present embodiment, FIG. 3 illustrates a cross-section of a portion of the non-display area NDA including the edge of the substrate 100 and located in the first area A1. Though FIG. 3 illustrates a cross-section of an edge portion of the substrate 100 in the first area A1, an edge portion of the substrate 100 in the second area A2 may also have the same structure. That is, FIG. 3 may be construed as illustrating a cross-section of an edge portion of the substrate 100 in a non-bending area not including the bending area BA.

Referring to FIG. 3, an inorganic insulating portion 110 may be at the edge portion of the substrate 100. Though FIG. 3 illustrates the inorganic insulating portion 110 as a multi-layer structure with a plurality of insulating layers stacked on each other, the inorganic insulating portion 110 may have a single-layer structure. The inorganic insulating portion 110 may be located on an entirety of the surfaces of the first area A1 and the second area A2 of the substrate 100 so as to extend from the display unit of the substrate 100 to the edge of the substrate 100.

The inorganic insulating portion 110 may have a plurality of dams 110a. The plurality of dams 110a may be formed by patterning a portion of the inorganic insulating portion 110. The plurality of dams 110a may surround the display area DA along the edge of the substrate 100, and may be spaced apart from each other by a small width. A plurality of grooves 110b may be between respective ones of the dams 110a. As illustrated in FIG. 3, the plurality of grooves 110b may be respectively between the plurality of dams 110a.

The inorganic insulating portion 110 may include a first insulating layer 113, and a second insulating layer 115 on the first insulating layer 113. Each of the first insulating layer 113 and the second insulating layer 115 may have a single layer structure, or may have a multi-layer structure with a plurality of layers stacked on each other. In this regard, the plurality of grooves 110b may penetrate the second insulating layer 115.

In another embodiment, the plurality of grooves 110b may penetrate both of the first insulating layer 113 and the second insulating layer 115. When the plurality of grooves 110b penetrate only the second insulating layer 115, at least a portion of an upper surface of the first insulating layer 113 may be exposed by the plurality of grooves 110b. In another embodiment, when the plurality of grooves 110b penetrate both of the first insulating layer 113 and the second insulating layer 115, at least a portion of an upper surface of the substrate 100 may be exposed by the plurality of grooves 110b.

The plurality of dams 110a may prevent a crack in the edge of the substrate 100 from spreading to the display area DA.

Figure 4:
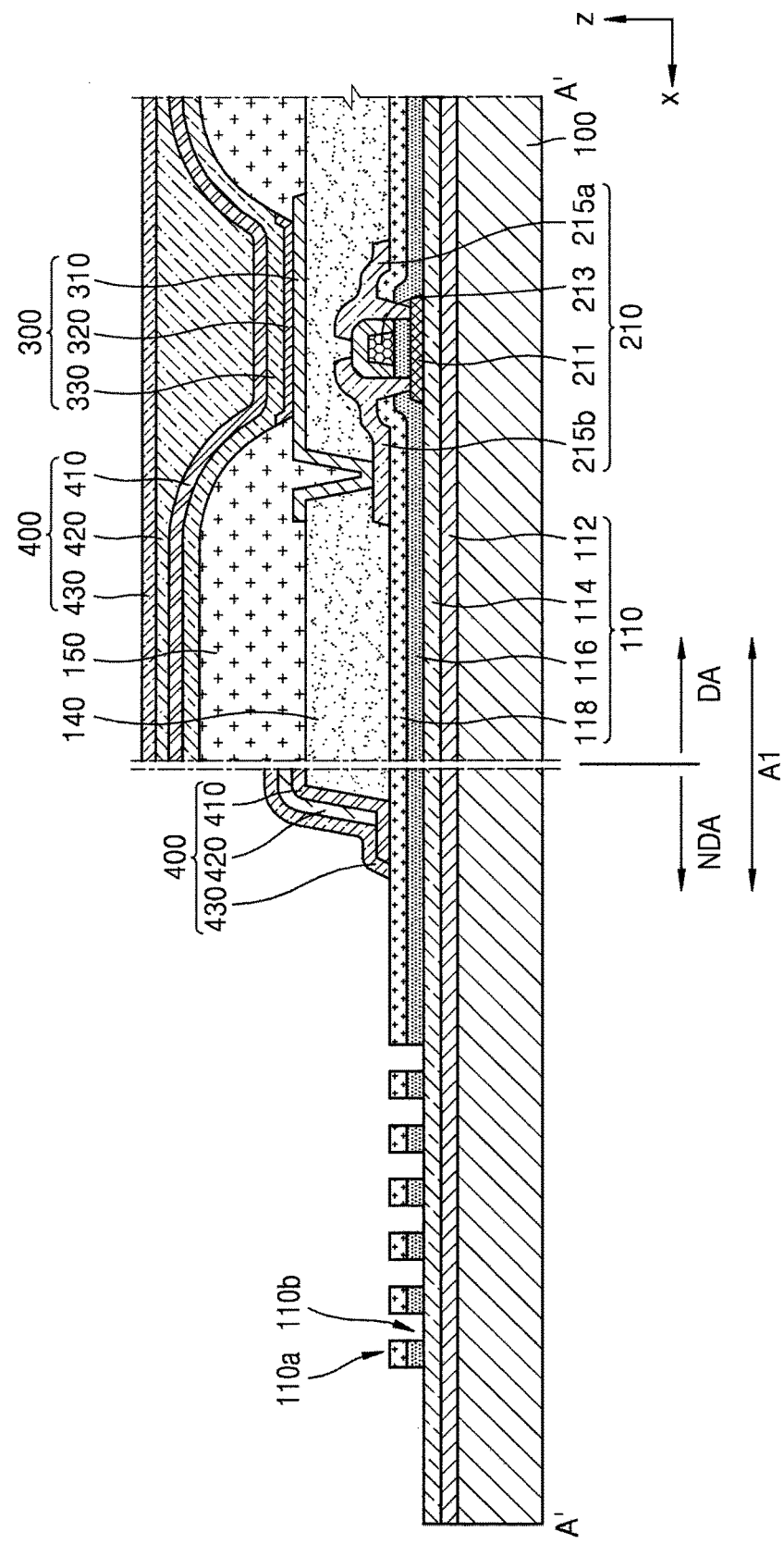
FIG. 4 is a schematic cross-sectional view of the display apparatus of FIG. 2, taken along the line A'-A'.

FIG. 4 is a schematic cross-sectional view of a cross-section of the display apparatus of FIG. 2, taken along the line A'-A'.

FIG. 4 enlarges and illustrates in detail the edge portion of the substrate 100 illustrated in FIG. 3, and at the same time, illustrates a cross-sectional structure extending to the display area DA.

Referring to FIG. 4, a display unit may be in the display area DA of the first area A1. The display unit may include a display device 300, and may externally display an image by controlling emission of the display device 300. In the present embodiment, the display unit includes an organic light-emitting device as the display device 300.

As illustrated in FIG. 4, not only the display device 300, but also a thin film transistor (TFT) 210 to which the display device 300 is electrically connected, may be in the display area DA of the substrate 100. FIG. 4 illustrates that an organic light-emitting device is located in the display area DA as the display device 300. A configuration in which the organic light-emitting device is electrically connected to the TFT 210 may be understood as a configuration in which a pixel electrode 310 is electrically connected to the TFT 210. Another TFT may also be located in a circumferential region outside the display area DA of the substrate 100 when suitable. The TFT in the circumferential region may be, for example, a portion of a circuit portion for controlling an electric signal that is applied to the display area DA.

The TFT 210 may include a semiconductor layer 211 including amorphous silicon, polycrystalline silicon, or an organic semiconductor material, a gate electrode 213, a source electrode 215a, and a drain electrode 215b.

To secure insulation of the semiconductor layer 211 from the gate electrode 213, a gate insulating layer 116 may be between the semiconductor layer 211 and the gate electrode 213. The gate insulating layer 116 may include an inorganic material, such as silicon oxide, silicon nitride, and/or silicon oxynitride.

Further, an interlayer insulating layer 118 may be on the gate electrode 213, the interlayer insulating layer 118 including an inorganic material, such as silicon oxide, silicon nitride, and/or silicon oxynitride. The source electrode 215a and the drain electrode 215b may be on the interlayer insulating layer 118. Insulating layers including an inorganic material may be formed by chemical vapor deposition (CVD) or atomic layer deposition (ALD). The same may be applied to embodiments that will be described below, and modifications thereof.

A barrier layer 112 and a buffer layer 114 may be between the TFT 210 having the above structure and the substrate 100. The barrier layer 112 and the buffer layer 114 may include an inorganic material, such as silicon oxide, silicon nitride, and/or silicon oxynitride. The barrier layer 112 and the buffer layer 114 may planarize the upper surface of the substrate 100, or may prevent, reduce, or minimize impurities from the substrate 100, etc. from penetrating into the semiconductor layer 211 of the TFT 210.

Also, a planarization layer 140 may be on the TFT 210. For example, as illustrated in FIG. 4, when an organic light-emitting device is above the TFT 210, the planarization layer 140 may generally planarize an upper portion of a protective layer covering the TFT 210. The planarization layer 140 may include an organic material such as acryl, benzocyclobutene (BCB), or hexamethyldisiloxane (HMDSO). Though FIG. 4 illustrates that the planarization layer 140 is a single layer, the planarization layer 140 may be variously modified. For example, the planarization layer 140 may have a multi-layer structure. Also, as illustrated in FIG. 4, the planarization layer 140 may have an opening outside the display area DA to physically separate a portion of the planarization layer 140 in the display area DA from a portion of the planarization layer 140 in the second area A2. The opening may be for reducing or preventing external impurities from reaching the inside of the display area DA via the planarization layer 140.

In the display area DA of the substrate 100, an organic light-emitting device may be on the planarization layer 140, the organic light-emitting device including the pixel electrode 310, an opposite electrode 330, and an intermediate layer 320 between the pixel electrode 310 and the opposite electrode 330, and also including an emission layer. As illustrated in FIG. 4, the pixel electrode 310 is electrically connected to the TFT 210 by contacting one of the source electrode 215a and the drain electrode 215b via an opening formed in the planarization layer 140, etc.

A pixel-defining layer 150 may be on the planarization layer 140. The pixel-defining layer 150 includes an opening corresponding to sub-pixels, that is, an opening exposing at least a central portion of the pixel electrode 310, and thus defines a pixel or sub-pixel. Also, in the case illustrated in FIG. 4, the pixel-defining layer 150 prevents an arc, etc. from occurring at the edge of the pixel electrode 310 by increasing a distance between the edge of the pixel electrode 310 and the opposite electrode 330, which is above the pixel electrode 310. The pixel-defining layer 150 may include an organic material, such as PI or HMDSO.

The intermediate layer 320 of the organic light-emitting device may include a low molecular weight material or a polymer material. When the intermediate layer 320 includes a low molecular weight material, the intermediate layer 320 may have a structure in which a hole injection layer (HIL), a hole transport layer (HTL), an emission layer (EML), an electron transport layer (ETL), an electron injection layer (EIL), etc. are stacked in a single or composite structure, and may include various organic materials, such as copper phthalocyanine (CuPc), N,N'-Di(naphthalene-1-yl)-N,N'-diphenyl-benzidine (NPB), and tris-8-hydroxyquinoline aluminum (Alq3). These layers may be formed by a vacuum deposition method.

When the intermediate layer 320 includes a polymer material, the intermediate layer 320 may have a structure including an HTL and an EML. In this case, the HTL may include PEDOT, and the EML may include a polymer material such as a poly-phenylenevinylene-based (PPV-based) material and a polyfluorene-based material. The intermediate layer 320 may be formed by using screen printing, inkjet printing, laser induced thermal imaging (LITI), or the like. However, the intermediate layer 320 is not necessarily limited thereto, and may have various structures in other embodiments. Also, the intermediate layer 320 may include a layer that is integrally formed over a plurality of separate pixel electrodes 310, or may include a layer that is patterned so as to correspond to respective ones of the plurality of pixel electrodes 310.

The opposite electrode 330 may be above the display area DA, and may cover the display area DA, as illustrated in FIG. 4. That is, the opposite electrode 330 may be integrally formed with respect to a plurality of organic light-emitting devices, and may correspond to the plurality of pixel electrodes 310.

Because the organic light-emitting devices may be damaged by external moisture or oxygen, etc., an encapsulation layer 400 may protect the organic light-emitting devices by covering the organic light-emitting devices. The encapsulation layer 400 may cover the display area DA, and may extend beyond the display area DA. As illustrated in FIG. 4, the encapsulation layer 400 may include a first inorganic encapsulation layer 410, an organic encapsulation layer 420, and a second inorganic encapsulation layer 430.

The first inorganic encapsulation layer 410 may cover the opposite electrode 330, and may include silicon oxide, silicon nitride, and/or silicon oxynitride. Other layers, such as a capping layer, etc., may be between the first inorganic encapsulation layer 410 and the opposite electrode 330 when suitable.

Because the first inorganic encapsulation layer 410 is formed along a structure therebelow, an upper surface of the first inorganic encapsulation layer 410 might not be planarized, as illustrated in FIG. 4. The organic encapsulation layer 420 may cover the first inorganic encapsulation layer 410, and unlike the first inorganic encapsulation layer 410, an upper surface of the organic encapsulation layer 420 may be planarized. Specifically, the upper surface of the organic encapsulation layer 420 may be approximately planarized in a portion corresponding to the display area DA. The organic encapsulation layer 420 may include one or more materials selected from the group consisting of PET, PEN, PC, PI, polyethylene sulfonate, polyoxymethylene (POM), PAR, and hexamethyldisiloxane.

The second inorganic encapsulation layer 430 may cover the organic encapsulation layer 420, and may include silicon oxide, silicon nitride, and/or silicon oxynitride. The second inorganic encapsulation layer 430 may contact the first inorganic encapsulation layer 410 at the edge thereof outside the display area DA so that the organic encapsulation layer 420 may not be externally exposed (e.g., so that the organic encapsulation layer 420 may be sealed).

Because the encapsulation layer 400 includes the first inorganic encapsulation layer 410, the organic encapsulation layer 420, and the second inorganic encapsulation layer 430, even when the encapsulation layer 400 has a crack, the crack may not spread between (e.g., may not be allowed to be connected between) the first inorganic encapsulation layer 410 and the organic encapsulation layer 420, or may not spread between the organic encapsulation layer 420 and the second inorganic encapsulation layer 430, due to the above-described multi-layered structure. Thus, formation of a path via which external moisture or oxygen, etc. penetrates into the display area DA may be reduced, prevented, or minimized.

Though not illustrated, a polarization plate may be located on the encapsulation layer 400 by using an optically clear adhesive (OCA). The polarization plate may reduce reflection of external light. For example, in a case in which external light passes through the polarization plate, is reflected by an upper surface of the opposite electrode 330, and then passes through the polarization plate again, a phase of the external light may be changed as the external light passes through the polarization plate twice. As a result, destructive interference may occur due to a difference between a phase of the reflected light and a phase of the external light entering the polarization plate, and consequently, visibility may be improved by reducing external light reflection. In another embodiment, the display apparatus may have a polarization plate omitted, and may reduce external light reflection by using a black matrix and a color filter.

Also, though not illustrated, a touch electrode having various patterns for a touchscreen function may be on the encapsulation layer 400.

In the present embodiment, the barrier layer 112, the buffer layer 114, the gate insulating layer 116, and the interlayer insulating layer 118, each including an inorganic material, may be commonly referred to as the inorganic insulating portion 110. As illustrated in FIG. 4, the inorganic insulating portion 110 may extend from the display area DA to the non-display area NDA, and may be at the edge of the substrate 100.

In the present embodiment, the inorganic insulating portion 110 in the non-display area NDA may include the plurality of dams 110a. In other words, the inorganic insulating portion 110 may have the plurality of grooves 110b, and the plurality of grooves 110b may be respectively between the dams 110a. In FIG. 4, the plurality of grooves 110b may expose at least a portion of the buffer layer 114. The plurality of grooves 110b exposing at least a portion of the buffer layer 114 may be construed as meaning the plurality of dams 110a including portions of the gate insulating layer 116 and the interlayer insulating layer 118.

In another embodiment, the plurality of grooves 110b may expose at least a portion of the barrier layer 112, the plurality of grooves 110b may expose at least a portion of the substrate 100, or the plurality of grooves 110b may expose at least a portion of the gate insulating layer 116. When the plurality of grooves 110b expose at least a portion of the barrier layer 112, the plurality of dams 110a may include portions of the buffer layer 114, the gate insulating layer 116, and the interlayer insulating layer 118. Alternatively, when the plurality of grooves 110b expose at least a portion of the substrate 100, the plurality of dams 110a may include portions of the barrier layer 112, the buffer layer 114, the gate insulating layer 116, and the interlayer insulating layer 118. Alternatively, when the plurality of grooves 110b expose at least a portion of the gate insulating layer 116, the plurality of dams 110a may include a portion of the interlayer insulating layer 118.

As described above, as the inorganic insulating portion 110 in the non-display area NDA (e.g., at the edge portion of the substrate 100) has the plurality of dams 110a and the plurality of grooves 110b, which are respectively located between the plurality of dams 110a, a crack in the edge of the substrate 100 may be prevented from spreading to the display area DA.

Figure 5:
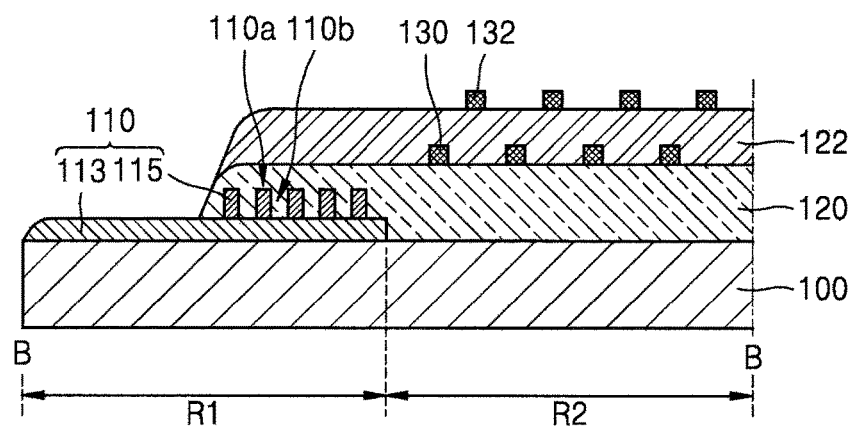
FIG. 5 is a schematic cross-sectional view of an embodiment of the display apparatus of FIG. 2, taken along the line B-B.
Figure 6:
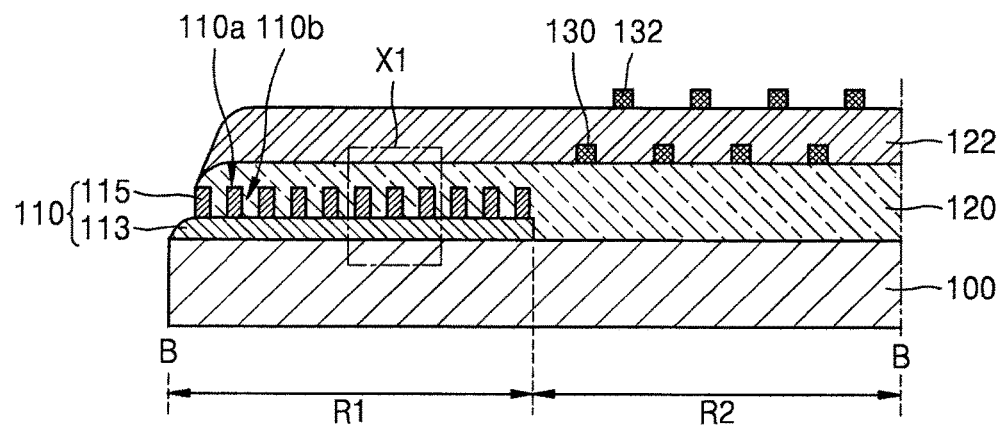
FIG. 6 is a schematic cross-sectional view of an embodiment of the display apparatus of FIG. 2, taken along the line B-B.

FIG. 5 is a schematic cross-sectional view of an embodiment of a cross-section of the display apparatus of FIG. 2, taken along the line B-B. FIG. 6 is a schematic cross-sectional view of another embodiment of the display apparatus of FIG. 2, taken along the line B-B.

Referring to FIG. 5 first, in the bending area BA, there may be the inorganic insulating portion 110 located along the edge of the substrate 100, and there may be a first organic layer 120 at least partially overlapping the inorganic insulating portion 110. Though FIG. 5 illustrates the inorganic insulating portion 110 as a multi-layer structure with a plurality of insulating layers stacked on each other, the inorganic insulating portion 110 may have a single-layer structure.

The inorganic insulating portion 110 may have a width (e.g., a predetermined width) along the edge of the substrate 100 where the bending area BA is located. An area where the inorganic insulating portion 110 is located includes the edge of the substrate 100, and thus may be defined as an edge area R1. The inorganic insulating portion 110 may be located only in the edge area R1, in which case a portion of the inorganic insulating portion 110 may have been removed from the bending area BA during manufacturing processes. The inorganic insulating portion 110 might not be in an area where wires are located on the bending area BA (e.g., might not be in a wiring area R2).

The inorganic insulating portion 110 may have the plurality of dams 110a and the plurality of grooves 110b, which are respectively located between the dams 110a. In the present embodiment, as illustrated in FIG. 5, the plurality of dams 110a may be located at only a portion of the inorganic insulating portion 110. Though FIG. 5 illustrates the plurality of dams 110a adjacent to the wiring area R2 (e.g., at an edge of the inorganic insulating portion 110), in another embodiment, the plurality of dams 110a may be adjacent to a center of the inorganic insulating portion 110, or adjacent to an edge of the substrate 100.

The first organic layer 120 may be in the wiring area R2 of the bending area BA. As described above, the inorganic insulating portion 110 might not be in the wiring area R2. That is, the first organic layer 120 may be directly on the substrate 100. However, in some cases, the barrier layer 112 and/or the buffer layer 114 may be partially at the wiring area R2, and the first organic layer 120 may be on the barrier layer 112 and/or the buffer layer 114.

The first organic layer 120 may at least partially overlap the inorganic insulating portion 110. The first organic layer 120 may cover at least some of the plurality of dams 110a in an area overlapping the inorganic insulating portion 110. As illustrated in FIG. 5, the first organic layer 120 may partially extend to the edge area R1 so as to cover the plurality of dams 110a of the inorganic insulating portion 110. At least a portion of the first organic layer 120 may be filled in the plurality of grooves 110b.

The inorganic insulating portion 110 may include the first insulating layer 113, and may include the second insulating layer 115 on the first insulating layer 113. Each of the first insulating layer 113 and the second insulating layer 115 may have a single layer structure, or each may have a multi-layer structure with a plurality of layers stacked on each other. In this regard, the plurality of grooves 110b may penetrate the second insulating layer 115. When the plurality of grooves 110b penetrate only the second insulating layer 115, at least a portion of an upper surface of the first insulating layer 113 may be exposed by the plurality of grooves 110b.

Referring to FIG. 6, the embodiment of FIG. 6 is different from that of FIG. 5 in that the plurality of dams 110a are located over the entire area of the inorganic insulating portion 110. Accordingly, the first organic layer 120 may be located on the inorganic insulating portion 110 so as to cover the plurality of dams 110a. At least a portion of the first organic layer 120 may be filled in the plurality of grooves 110b between the dams 110a. Accordingly, as illustrated in FIG. 6, the first organic layer 120 may extend to the edge of the substrate 100.

Because a structure on the wiring area R2 in the embodiment of FIG. 5 is the same as that in the embodiment of FIG. 6, the structure will be commonly described hereinafter.

Referring to FIGS. 5 and 6, a first wiring portion 130 may be on the first organic layer 120. A second organic layer 122 may be located on the first wiring portion 130 so as to cover the first wiring portion 130. A second wiring portion 132 may be on the second organic layer 122. In this regard, the first wiring portion 130 and the second wiring portion 132 might not overlap each other.

The first wiring portion 130 and the second wiring portion 132 may include the same material as that of the source electrode 215a and/or the drain electrode 215b of the TFT 210. The TFT 210 of the display apparatus according to the present embodiment may include first source and drain electrodes, and second source and drain electrodes. The first wiring portion 130 may include the same material as that of the first source and drain electrodes, and the second wiring portion 132 may include the same material as that of the second source and drain electrodes. However, the present disclosure is not limited thereto, and the first wiring portion 130 and the second wiring portion 132 may include the same material as that of other conductive layers, such as the gate electrode 213 or the pixel electrode 310.

Figure 7:
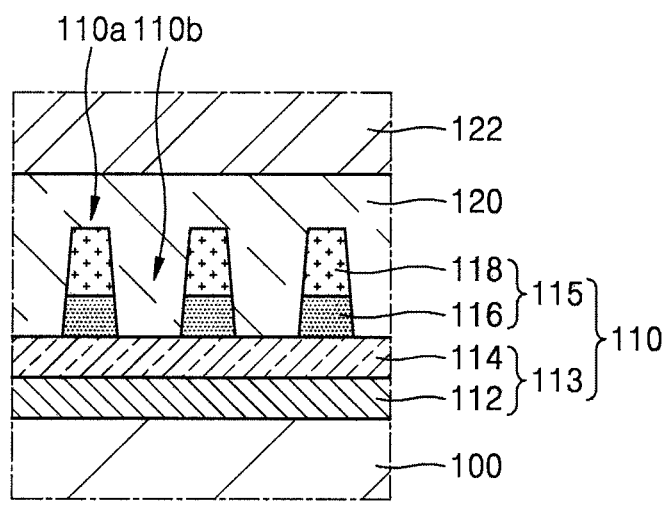
FIG. 7 is a schematic enlarged view of a portion X1 of FIG. 6.

FIG. 7 is a schematic enlarged view of a portion X1 of FIG. 6.

Referring to FIG. 7, the inorganic insulating portion 110 according to the present embodiment may have a multi-layer structure. Referring to FIG. 7 with FIG. 4, the inorganic insulating portion 110 may include the barrier layer 112, the buffer layer 114, the gate insulating layer 116, and the interlayer insulating layer 118, each including an inorganic material.

The inorganic insulating portion 110 may include the plurality of dams 110a and grooves 110b between respective dams 110a. In the present embodiment, the inorganic insulating portion 110 includes the first insulating layer 113 and the second insulating layer 115, and the plurality of grooves 110b may penetrate the second insulating layer 115. That is, a portion of the inorganic insulating portion 110 penetrated by the plurality of grooves 110b may be defined as the second insulating layer 115, and a portion of the inorganic insulating portion 110 not penetrated by the plurality of grooves 110b may be defined as the first insulating layer 113. As the plurality of grooves 110b penetrate the second insulating layer 115, the plurality of dams 110a may include portions of the second insulating layer 115.

Though FIG. 7 illustrates the first insulating layer 113 including the barrier layer 112 and the buffer layer 114, and the second insulating layer 115 including the gate insulating layer 116 and the interlayer insulating layer 118, the present disclosure is not necessarily limited thereto.

In the present embodiment, the plurality of dams 110a may include portions of the gate insulating layer 116 and the interlayer insulating layer 118, and accordingly, the plurality of grooves 110b may expose a portion of an upper surface of the buffer layer 114.

In another embodiment, when the first insulating layer 113 includes the barrier layer 112, and when the second insulating layer 115 includes the buffer layer 114, the gate insulating layer 116, and the interlayer insulating layer 118, the plurality of dams 110a may include portions of the buffer layer 114, the gate insulating layer 116, and the interlayer insulating layer 118, and accordingly, the plurality of grooves 110b may expose a portion of an upper surface of the barrier layer 112.

In another embodiment, when the first insulating layer 113 includes the barrier layer 112, the buffer layer 114, and the gate insulating layer 116, and when the second insulating layer 115 includes the interlayer insulating layer 118, the plurality of dams 110a may include the interlayer insulating layer 118, and accordingly, the plurality of grooves 110b may expose a portion of an upper surface of the gate insulating layer 116.

The first organic layer 120 and the second organic layer 122 may be on the inorganic insulating portion 110. A portion of the first organic layer 120 may be filled in the plurality of grooves 110b.

In the related art, to make it easy to bend a substrate, all of the inorganic layers on a bending area are removed and only an organic layer is provided. However, the structure including only an organic layer as described above is vulnerable to an external shock, and in particular, a crack in the edge of the substrate may cause a failure in wires.

In the present embodiment, the inorganic insulating portion 110 may be located along the edge of the substrate 100 located in the bending area BA (e.g., to have a predetermined width) and may include the plurality of dams 110a, and an organic layer may cover the plurality of dams 110a. Thus, a crack in the edge of the substrate 100 may be prevented from spreading to a wiring portion. As a result, bending in the bending area BA may be facilitated, and short circuits of wiring may be avoided or minimized, and accordingly, a display apparatus having an improved expected lifespan may be implemented.

Figure 8:
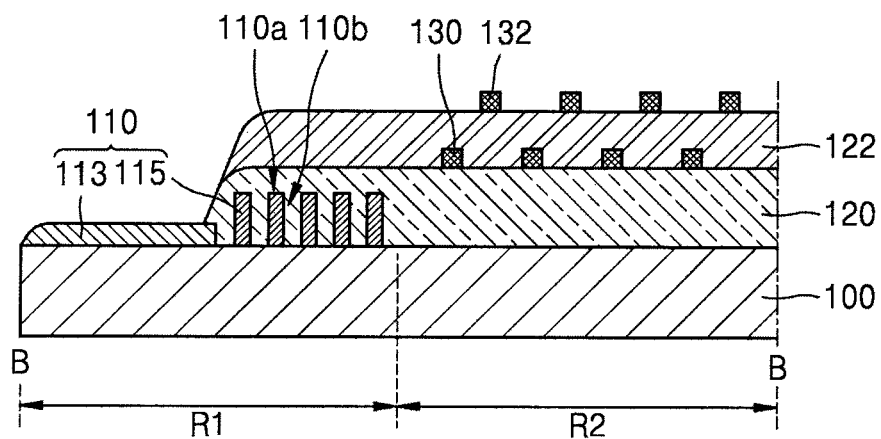
FIG. 8 is a schematic cross-sectional view of an embodiment of the display apparatus of FIG. 2, taken along the line B-B.
Figure 9:
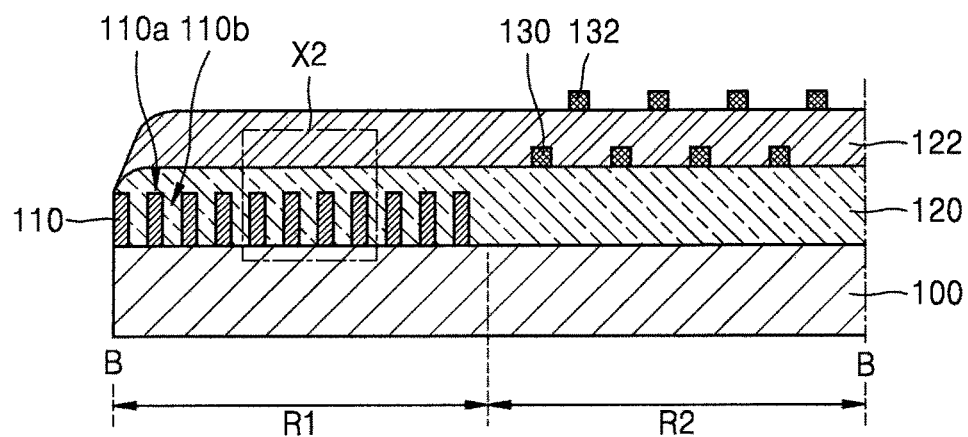
FIG. 9 is a schematic cross-sectional view of an embodiment of the display apparatus of FIG. 2, taken along the line B-B.

FIG. 8 is a schematic cross-sectional view of an embodiment of the display apparatus of FIG. 2, taken along the line B-B. FIG. 9 is a schematic cross-sectional view of another embodiment of the display apparatus of FIG. 2, taken along the line B-B.

Referring to FIG. 8, in the bending area BA, there may be the inorganic insulating portion 110 located along the edge of the substrate 100, and the first organic layer 120 may at least partially overlap the inorganic insulating portion 110.

Though FIG. 8 illustrates the inorganic insulating portion 110 as one layer, the inorganic insulating portion 110 may have a multi-layer structure with a plurality of insulating layers stacked on each other.

The inorganic insulating portion 110 may have a width (e.g., a predetermined width) along the edge of the substrate 100 where the bending area BA is located. An area where the inorganic insulating portion 110 is located includes the edge of the substrate 100, and thus may be defined as the edge area R1. The inorganic insulating portion 110 may be located exclusively in the edge area R1, which means that a portion of the inorganic insulating portion 110 may be removed from the bending area BA during manufacturing processes. The inorganic insulating portion 110 might not be in an area where wires are located on the bending area BA, which may be defined as the wiring area R2.

The inorganic insulating portion 110 may have the plurality of dams 110a, and the grooves 110b respectively located between the plurality of dams 110a. In the present embodiment, as illustrated in FIG. 8, the plurality of dams 110a may be located exclusively at a portion of the inorganic insulating portion 110. Though FIG. 8 illustrates the plurality of dams 110a adjacent to the wiring area R2, in another embodiment, the plurality of dams 110a may be adjacent to the center of the inorganic insulating portion 110 or the edge of the substrate 100.

The first organic layer 120 may be in the wiring area R2 of the bending area BA. As described above, the inorganic insulating portion 110 may be omitted from the wiring area R2. That is, the first organic layer 120 may be directly on the substrate 100. However, in some cases, the barrier layer 112 and/or the buffer layer 114 may be partially on the wiring area R2, and the first organic layer 120 may be on the barrier layer 112 and/or the buffer layer 114.

The first organic layer 120 may at least partially overlap the inorganic insulating portion 110. The first organic layer 120 may cover at least some of the plurality of dams 110a in an area overlapping the inorganic insulating portion 110 or the edge area R1. As illustrated in FIG. 8, the first organic layer 120 may partially extend to the edge area R1 so as to cover the plurality of dams 110a of the inorganic insulating portion 110. At least a portion of the first organic layer 120 may be filled in the plurality of grooves 110b.

The inorganic insulating portion 110 may include the first insulating layer 113 and the second insulating layer 115 next to the first insulating layer 113. Each of the first insulating layer 113 and the second insulating layer 115 may have a single layer structure, or may have a multi-layer structure with a plurality of layers stacked on each other. In this regard, in some embodiments, the plurality of grooves 110b may penetrate both of the first insulating layer 113 and the second insulating layer 115. When the plurality of grooves 110b penetrate both of the first insulating layer 113 and the second insulating layer 115, at least a portion of an upper surface of the substrate 100 may be exposed by the plurality of grooves 110b.

Referring to FIG. 9, the embodiment of FIG. 9 is different from that of FIG. 8 in that the plurality of dams 110a are located over the entire area of the inorganic insulating portion 110. Accordingly, the first organic layer 120 may be located on the inorganic insulating portion 110 so as to cover the plurality of dams 110a. At least a portion of the first organic layer 120 may be filled in the plurality of grooves 110b and between the plurality of dams 110a. Accordingly, as illustrated in FIG. 9, the first organic layer 120 may extend to the edge of the substrate 100.

Because a structure on the wiring area R2 in the embodiment of FIG. 8 is the same as that in the embodiment of FIG. 9, the structure will be commonly described hereinafter.

Referring to FIGS. 8 and 9, the first wiring portion 130 may be on the first organic layer 120. The second organic layer 122 may be located on the first wiring portion 130 so as to cover the first wiring portion 130. The second wiring portion 132 may be on the second organic layer 122. In this regard, the first wiring portion 130 and the second wiring portion 132 may be situated to not overlap each other.

The first wiring portion 130 and the second wiring portion 132 may include the same material as that of the source electrode 215a and/or the drain electrode 215b of the TFT 210. The TFT 210 of the display apparatus according to the present embodiment may include first source and drain electrodes, and second source and drain electrodes. Further, the first wiring portion 130 may include the same material as that of the first source and drain electrodes, and the second wiring portion 132 may include the same material as that of the second source and drain electrodes. However, the present disclosure is not limited thereto, and the first wiring portion 130 and the second wiring portion 132 may include the same material as that of other conductive layers, which include the gate electrode 213 or the pixel electrode 310.

Figure 10:
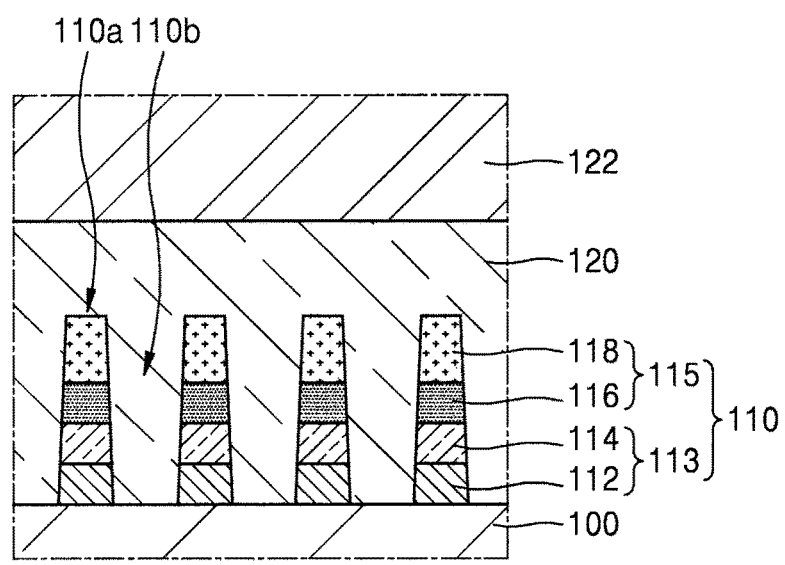
FIG. 10 is a schematic enlarged view of a portion X2 of FIG. 9.

FIG. 10 is a schematic enlarged view of a portion X2 of FIG. 9.

Referring to FIG. 10, the inorganic insulating portion 110 according to the present embodiment may have a multi-layer structure. Referring to FIG. 10 with FIG. 4, the inorganic insulating portion 110 may include the barrier layer 112, the buffer layer 114, the gate insulating layer 116, and the interlayer insulating layer 118, each of which including an inorganic material.

The inorganic insulating portion 110 may include the plurality of dams 110a, and the plurality of grooves 110b that are respectively located between the dams 110a. In the present embodiment, the inorganic insulating portion 110 includes the first insulating layer 113 and the second insulating layer 115, and the plurality of grooves 110b may penetrate the first insulating layer 113 and the second insulating layer 115. That is, the plurality of grooves 110b may penetrate the inorganic insulating portion 110. As the plurality of grooves 110b penetrate the inorganic insulating portion 110, the plurality of dams 110a may include a portion of the inorganic insulating portion 110.

Though FIG. 10 illustrates the first insulating layer 113 including the barrier layer 112 and the buffer layer 114, and the second insulating layer 115 including the gate insulating layer 116 and the interlayer insulating layer 118, the present disclosure is not necessarily limited thereto.

In the present embodiment, the plurality of dams 110a may include portions of the barrier layer 112, the buffer layer 114, the gate insulating layer 116, and the interlayer insulating layer 118, and accordingly, the plurality of grooves 110b may expose a portion of an upper surface of the substrate 100.

The first organic layer 120 and the second organic layer 122 may be on the inorganic insulating portion 110. A portion of the first organic layer 120 may be filled in the plurality of grooves 110b.

In the related art, to facilitate bending a substrate, all of the inorganic layers on a bending area are removed, and only an organic layer is provided. However, the structure including only an organic layer, as described above, is vulnerable to an external shock, and in particular, a crack in the edge of the substrate may cause a failure in wires.

In the present embodiment, the inorganic insulating portion 110 may be located along the edge of the substrate 100 located in the bending area BA (e.g., so as to have a predetermined width) and may include the plurality of dams 110a, and an organic layer may cover the plurality of dams 110a. Thus, a crack in the edge of the substrate 100 may be limited or prevented from spreading to a wiring portion. As a result, bending in the bending area BA may be facilitated, and short circuits of wiring may be reduced or minimized, and accordingly, a display apparatus having a longer expected life may be implemented.

Figure 11:
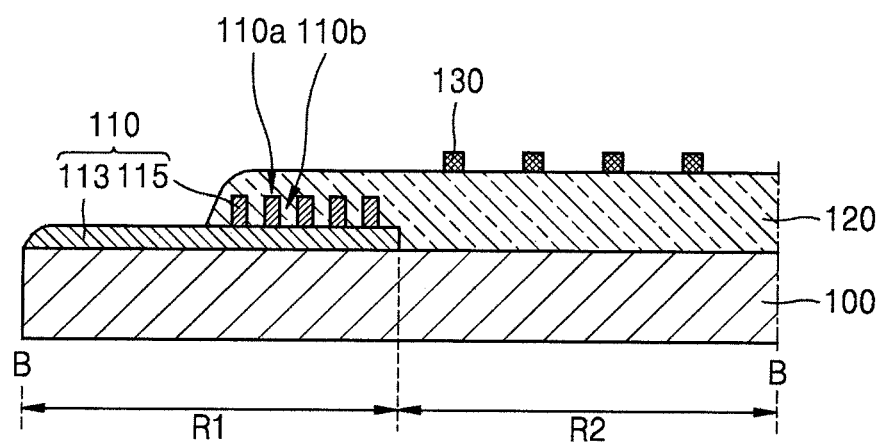
FIG. 11 is a schematic cross-sectional view of an embodiment of the display apparatus of FIG. 2, taken along the line B-B.

FIG. 11 is a schematic cross-sectional view of another embodiment of the display apparatus of FIG. 2, taken along the line B-B.

Referring to FIG. 11, in the bending area BA of the display apparatus according to the present embodiment, there may be the inorganic insulating portion 110 located along the edge of the substrate 100, and there may be the first organic layer 120 at least partially overlapping the inorganic insulating portion 110. Though FIG. 11 illustrates the inorganic insulating portion 110 as a multi-layer structure with a plurality of insulating layers stacked on each other, the inorganic insulating portion 110 may be a single layer.

The inorganic insulating portion 110 illustrated in FIG. 11 may have the structure of the embodiment of FIG. 5. That is, the inorganic insulating portion 110 may have a width (e.g., a predetermined width) along the edge of the substrate 100 where the bending area BA is located, and may have the plurality of dams 110a and the plurality of grooves 110b respectively located between the plurality of dams 110a.

In another embodiment, the inorganic insulating portion 110 illustrated in FIG. 11 may have the structure of the embodiment of FIG. 6, 8, or 9. Accordingly, the above description of the embodiment of FIG. 5, 6, 8, or 9 is cited as a description of the inorganic insulating portion 110 according to the present embodiment.

In the present embodiment, the first wiring portion 130 may be on the first organic layer 120. The first wiring portion 130 may include the same material as that of the source electrode 215a and/or the drain electrode 215b of the TFT 210. However, the present disclosure is not limited thereto, and the first wiring portion 130 may include the same material as that of other conductive layers, such as the gate electrode 213 or the pixel electrode 310.

Figure 12:
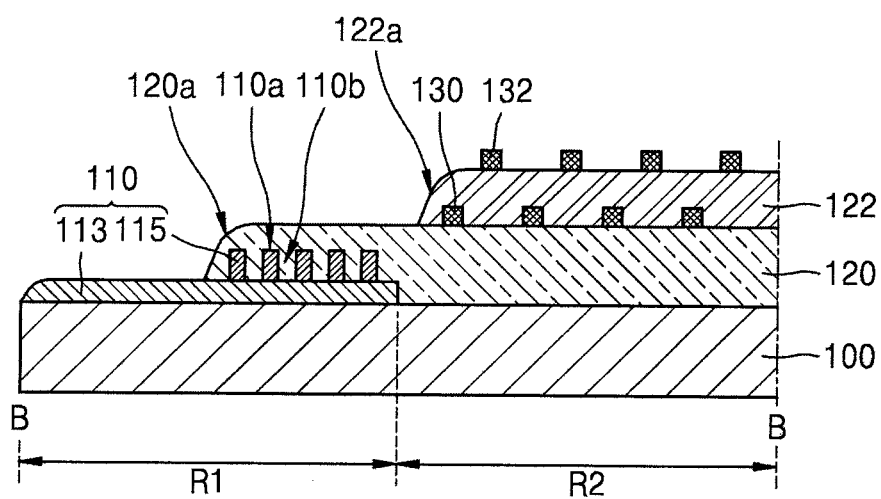
FIG. 12 is a schematic cross-sectional view of an embodiment of the display apparatus of FIG. 2, taken along the line B-B.
Figure 13:
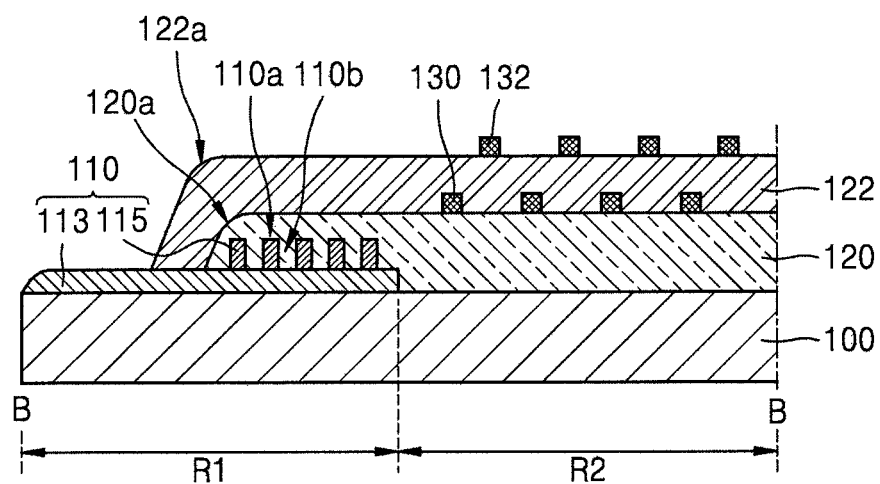
FIG. 13 is a schematic cross-sectional view of an embodiment of the display apparatus of FIG. 2, taken along the line B-B.

FIG. 12 is a schematic cross-sectional view of another embodiment of the display apparatus of FIG. 2, taken along the line B-B. FIG. 13 is a schematic cross-sectional view of another embodiment of the display apparatus of FIG. 2, taken along the line B-B.

Referring to FIG. 12, in the bending area BA of the display apparatus according to the present embodiment, there may be the inorganic insulating portion 110 located along the edge of the substrate 100, the first organic layer 120 at least partially overlapping the inorganic insulating portion 110, and the second organic layer 122 located on the first organic layer 120. Though FIG. 12 illustrates the inorganic insulating portion 110 as a multi-layer structure with a plurality of insulating layers stacked on each other, the inorganic insulating portion 110 may have one layer.

The inorganic insulating portion 110 illustrated in FIG. 12 may have the structure of the embodiment of FIG. 5. That is, the inorganic insulating portion 110 may have a width (e.g., a predetermined width) along the edge of the substrate 100 where the bending area BA is located, and may have the plurality of dams 110a and the plurality of grooves 110b, which are respectively located between the dams 110a.

In another embodiment, the inorganic insulating portion 110 illustrated in FIG. 12 may have the structure of the embodiment of FIG. 6, 8, or 9. Accordingly, the above description of the embodiment of FIG. 5, 6, 8, or 9 is cited as a description of the inorganic insulating portion 110 according to the present embodiment.

The first wiring portion 130 may be on the first organic layer 120 according to the present embodiment. The second organic layer 122 may be located on the first wiring portion 130 so as to cover the first wiring portion 130. The second wiring portion 132 may be on the second organic layer 122. In this regard, the first wiring portion 130 and the second wiring portion 132 may be arranged to not overlap each other.

The first wiring portion 130 and the second wiring portion 132 may include the same material as that of the source electrode 215a and/or the drain electrode 215b of the TFT 210. However, the present disclosure is not limited thereto, and the first wiring portion 130 and the second wiring portion 132 may include the same material as that of other conductive layers including the gate electrode 213 or the pixel electrode 310.

In the present embodiment, the first organic layer 120 may cover the second insulating layer 115. That is, the first organic layer 120 may cover the plurality of dams 110a, and at least a portion of the first organic layer 120 may be filled in the plurality of grooves 110b respectively located between the dams 110a.

The second organic layer 122 may be on the first organic layer 120, and as illustrated in FIG. 12, an end of the second organic layer 122 and an end of the first organic layer 120 might not coincide with each other. In other words, the end of the second organic layer 122 may be more adjacent to the wiring area R2 than the end of the first organic layer 120. Though FIG. 12 illustrates the end of the second organic layer 122 nearly coinciding with the end of the first organic layer 120, the present disclosure is not necessarily limited thereto.

In another embodiment, as illustrated in FIG. 13, an end of the first organic layer 120 and an end of the second organic layer 122 might not coincide with each other, and in this case, the end of the second organic layer 122 may cover the end of the first organic layer 120. That is, the end of the second organic layer 122 may be more adjacent to the edge of the substrate 100 than the end of the first organic layer 120.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by one of ordinary skill in the art that various changes in form and details may be made therein without departing from the spirit and scope as defined by the following claims and their functional equivalents.

What is claimed is:

1. A display apparatus comprising:
   a substrate having:
      a first area;
      a second area; and
      a bending area between the first area and the second area, and being configured to be bent around a bending axis extending in a first direction;
   an inorganic insulating portion on the bending area, having a width along an edge of the substrate, and comprising a plurality of dams defining a plurality of grooves; and
   a first organic layer on the bending area, and partially overlapping the inorganic insulating portion to cover at least some of the dams.

2. The display apparatus of claim 1, wherein at least a portion of the first organic layer is filled in the plurality of grooves.

3. The display apparatus of claim 1, wherein the inorganic insulating portion comprises:
   a first insulating layer on the substrate; and
   a second insulating layer on the first insulating layer.

4. The display apparatus of claim 3, wherein the plurality of grooves penetrate the second insulating layer.

5. The display apparatus of claim 4, wherein the plurality of grooves expose at least a portion of the first insulating layer.

6. The display apparatus of claim 3, wherein the plurality of grooves penetrate the first insulating layer and the second insulating layer.

7. The display apparatus of claim 6, wherein the plurality of grooves expose at least a portion of the substrate.

8. The display apparatus of claim 1, further comprising a first wiring portion on the first organic layer.

9. The display apparatus of claim 8, further comprising a second organic layer on the first organic layer.

10. The display apparatus of claim 9, further comprising a second wiring portion on the second organic layer.

11. The display apparatus of claim 10, wherein the first wiring portion and the second wiring portion do not overlap each other.

12. The display apparatus of claim 1, wherein the bending area comprises:
   an edge area having a width along the edge of the substrate; and
   a wiring area at a side of the edge area, and
   wherein the inorganic insulating portion is on the edge area outside of the wiring area.

13. The display apparatus of claim 12, wherein the first organic layer is on the wiring area and is on at least a portion of the edge area.

14. The display apparatus of claim 1, wherein the plurality of dams are located over an entire surface of the inorganic insulating portion.

15. The display apparatus of claim 14, wherein the first organic layer covers all or some of the plurality of dams.

16. The display apparatus of claim 1, wherein the plurality of dams are located over a portion of the inorganic insulating portion.

17. The display apparatus of claim 16, wherein the first organic layer covers all or some of the plurality of dams.

18. The display apparatus of claim 1, further comprising:
   a display unit on the first area of the substrate; and
   a panel driver unit on the second area of the substrate.

* * * * *